(12) United States Patent
Sugita et al.

(10) Patent No.: US 10,401,745 B2
(45) Date of Patent: Sep. 3, 2019

(54) EXPOSURE APPARATUS AND ARTICLE MANUFACTURING METHOD

(71) Applicant: CANON KABUSHIKI KAISHA, Tokyo (JP)

(72) Inventors: Hikaru Sugita, Utsunomiya (JP); Masato Homma, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/234,767

(22) Filed: Dec. 28, 2018

(65) Prior Publication Data

US 2019/0137895 A1 May 9, 2019

Related U.S. Application Data

(63) Continuation of application No. PCT/JP2017/028946, filed on Aug. 9, 2017.

(30) Foreign Application Priority Data

Sep. 16, 2016 (JP) .................................. 2016-181306

(51) Int. Cl.
*G03F 7/20* (2006.01)
*G03F 7/26* (2006.01)
(Continued)

(52) U.S. Cl.
CPC ..... *G03F 7/70933* (2013.01); *G02B 27/0006* (2013.01); *G03F 7/20* (2013.01);
(Continued)

(58) Field of Classification Search
CPC ..... G02B 27/0006; G03F 7/0007; G03F 7/20; G03F 7/26; G03F 7/70908; G03F 7/70916; G03F 7/70925; G03F 7/70933
(Continued)

(56) References Cited

U.S. PATENT DOCUMENTS 6,555,834 B1* 4/2003 Loopstra ............. G03F 7/70716
250/492.22
7,214,549 B2* 5/2007 Tanaka ................ G03F 7/70691
257/E21.521
(Continued)

FOREIGN PATENT DOCUMENTS

JP 2001028331 A 1/2001
JP 2002373852 A 12/2002
(Continued)

OTHER PUBLICATIONS

International Search Report issued in Intl. Appln. No. PCT/JP2017/028946 dated Nov. 7, 2017. English translation provided.
(Continued)

*Primary Examiner* — Colin W Kreutzer
(74) *Attorney, Agent, or Firm* — Rossi, Kimms & McDowell LLP

(57) ABSTRACT

An exposure apparatus that exposes a substrate W has a rectifying mechanism 3 that supplies a gas so as to traverse the optical axis of a projection optical system 1, in a space between the projection optical system 1 and the substrate W that face each other, the flow rectifying mechanism 3 supplies a gas so as to have a flow rate distribution in which a flow rate at a second position that is located farther from the projection optical system 1 than a first position is higher than a flow rate at the first position, and the rectifying mechanism 3 includes a first rectifying mechanism 302 that forms a flow rate distribution by dividing a flow path of the gas into a first flow path of a gas flowing to a first position and a second flow path of a gas flowing to a second position.

13 Claims, 9 Drawing Sheets

(51) Int. Cl.
*G02B 27/00* (2006.01)
*G03F 7/00* (2006.01)

(52) U.S. Cl.
CPC ............ *G03F 7/26* (2013.01); *G03F 7/70916* (2013.01); *G03F 7/0007* (2013.01)

(58) Field of Classification Search
USPC ................. 355/30, 53, 72, 77; 359/507, 509
See application file for complete search history.

(56) References Cited

U.S. PATENT DOCUMENTS

| | | | |
|---|---|---|---|
| 7,760,323 B2 | 7/2010 | To et al. | |
| 2002/0191163 A1 | 12/2002 | Hasegawa et al. | |
| 2005/0030496 A1 | 2/2005 | Chibana et al. | |
| 2005/0254025 A1* | 11/2005 | Lallemant | G03F 7/70933 |
| | | | 355/30 |
| 2006/0209274 A1 | 9/2006 | To et al. | |
| 2011/0228239 A1* | 9/2011 | Gosen | G03F 7/70916 |
| | | | 355/30 |
| 2015/0355557 A1* | 12/2015 | Cuypers | G03F 7/70358 |
| | | | 355/72 |

FOREIGN PATENT DOCUMENTS

| | | |
|---|---|---|
| JP | 2004228497 A | 8/2004 |
| JP | 2004266051 A | 9/2004 |
| JP | 2006245401 A | 9/2006 |

OTHER PUBLICATIONS

Written Opinion issued in Intl. Appln. No. PCT/JP2017/028946 dated Nov. 7, 2017.

\* cited by examiner

EXPOSURE APPARATUS AND ARTICLE MANUFACTURING METHOD

CROSS-REFERENCE TO RELATED APPLICATIONS

This application is a Continuation of International Patent Application No. PCT/JP2017/028946, filed Aug. 9, 2017 which claims the benefit of Japanese Patent Application No. 2016-181306, filed Sep. 16, 2016, both of which are hereby incorporated by reference herein in their entirety.

BACKGROUND OF TEE INVENTION

Field of the Invention

The present invention relates to an exposure apparatus and an article manufacturing method.

Background Art

In a process of manufacturing a semiconductor device such as a liquid crystal panel, many processes are applied to a substrate, and among them, an exposure process for printing a pattern of an original (reticle) is an important process, which is a key to semiconductor manufacturing. As an apparatus that performs this process, an exposure apparatus is known. Various optical elements are used in the exposure apparatus, for example, an illumination optical system that irradiates a light emitted from a light source onto an original surface, a projection optical system, and in addition, a lens, and a mirror. Fogging of the optical element is one of factors of deteriorating the optical performance in using this optical element. Fogging of the optical element is a phenomenon in which contaminants adhere to a surface of the optical element, thereby lowering a transmittance of an exposure light. Among fogging of the optical elements, an optical element provided on the final surface of the projection optical system that transfers the pattern of the original onto the substrate is located directly above the substrate, so that, in particular, fogging of the optical element easily occurs.

As a countermeasure against fogging of the optical element provided on the final surface of this projection optical system, a measure has been carried out in which a gas supply mechanism is provided and supplies a purge gas to a space between the optical element and the substrate. By the inflow of the purge gas to the space between the optical element and the substrate, a resist gas generated from the substrate is guided to the outside of the optical element so as not to contact the optical element. However, since a small amount of contaminants is contained in the purge gas due to, for example, degassing generated from a pipe in the path, the contaminants pass over the surface of the optical element due to the inflow of the purge gas, and as a result, the contaminants adhere to the optical element and fogging occurs. As a countermeasure against fogging of the optical element, in Patent Literature 1, in the inflow of a gas into a casing, the gas is divided into a plurality of paths and discharged from outlet ports to disperse a flow rate, and the flow rate of the gas is lowered below a predetermined flow rate. Additionally, in Patent Literature 2, a rectifying unit is provided in which, in supplying a purge gas, an optical path space is formed between the optical element and the substrate by surrounding the optical element by a shielding member, the flow of the gas is directed to a region facing a gas supply device and an optical path space, and the gas is guided to the outside of the optical path space.

CITATION LIST

Patent Literature

Patent Literature 1: Japanese Patent Application Laid-Open No. 2001-28331
Patent Literature 2: Japanese Unexamined Patent Publication No. 2006-245401

However, lowering the flow rate of the purge gas causes a difficulty in guiding contaminants not caused by a purge gas so as to separate from the vicinity of (a surface facing the substrate) the projection optical system. Additionally, increasing the flow rate of the purge gas may increase contaminants due to the purge gas, which reaches (the surface facing the substrate of) the projection optical system.

The present invention is to provide an exposure apparatus that is advantageous in protecting a projection optical system from fogging.

SUMMARY OF THE INVENTION

In order to solve the above-described problems, an exposure apparatus that exposes a substrate via an original plate and a projection optical system comprises a supply unit configured to supply a gas so as to cross the optical axis of the projection optical system, in a space between the projection optical system and the substrate facing each other, wherein the supply unit supplies the gas such that the gas crossing the optical axis in the space has a flow rate distribution in which a flow rate at a second position located farther from the projection optical system than a first position is higher than a flow rate at the first position, and wherein the supply unit includes a first rectifying member that forms the flow rate distribution by dividing a flow path of the gas into a first flow path of the gas flowing to the first position and a second flow path of the gas flowing to the second position.

Further features of the present invention will become apparent from the following description of exemplary embodiments with reference to the attached drawings.

DESCRIPTION OF EMBODIMENTS

First Embodiment

Figure 1:
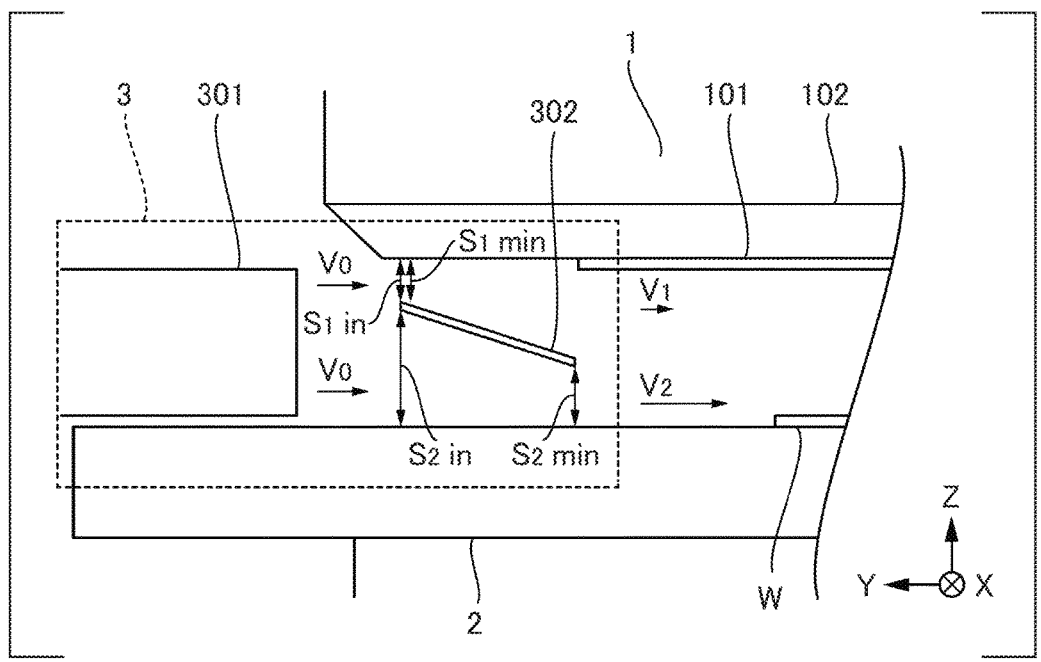
FIG. 1 illustrates a rectifying mechanism according to a first embodiment.

FIG. 1 illustrates a rectifying mechanism according to the first embodiment. A rectifying mechanism 3 is provided in an exposure apparatus in order to form a flow of a gas such as a purge gas to be supplied to a space between an optical element 101, which is located directly above a substrate W and provided on the final surface of a projection optical system 1 that projects an exposure light, and the substrate W. The rectifying mechanism 3 of the present embodiment supplies a gas having a flow rate distribution rectified by a rectifying member 302 to the space between the optical element 101 located on the final surface of the projection optical system 1 and the substrate W placed on a moving stage 2, in one direction crossing the optical axis direction of the projection optical system 1.

The rectifying mechanism 3 is a supply unit that includes a gas supply mechanism 301 and the first rectifying member 302, and supplies a gas to a space (exposure space) between the optical element 101 and the substrate W facing each other, in one direction crossing the optical axis direction of the projection optical system 1. The gas supply mechanism 301 supplies a gas such as a purge gas to the space (exposure space) between the optical element 101 and the substrate W. The first rectifying member 302 is a resistance that is located so as to form a first flow path and a second flow path by dividing the gas exiting from the gas supply mechanism 301 into two paths, the optical element 101 side (first position) and the substrate W side (second position), in a space between the gas supply mechanism 301 and the exposure space (on the upstream side of the exposure space). As shown in FIG. 1, the rectifying member is formed such that a height of the flow path on the optical element 101 side gradually increases while a height of the flow path on the substrate W side is gradually reduced. The height of the second flow path on the substrate W side is reduced by the first rectifying member 302, thereby reducing a cross-sectional area of the flow path on the substrate W side. The flow rate V2 of the second flow path on the substrate W side (the second position) can be increased more than the flow rate V0 output from the gas supply mechanism 301 by reducing the cross-sectional area of the flow path on the substrate W side. In contrast, the cross-sectional area of the flow path increases due to the increase in the height of the first flow path on the optical element 101 side. The flow rate V1 of the first flow path on the optical element 101 side (first position) is slower than the flow rate V0 output from the gas supply mechanism 301 because the cross-sectional area of the first flow path on the optical element 101 side is increased. As a result, a flow rate distribution is formed in which the flow rate on the substrate W side increases and the flow rate on the optical element 101 side decreases by the first rectifying member 302.

Since the flow rate V2 on the substrate W side is high, the resist gas existing from the substrate W can be blown toward the downstream side of the optical element 101 in the flow path direction without reaching the surface of the optical element 101, and as a result, fogging of the optical element 101 due to the resist gas can be reduced. Additionally, it is possible to reduce a flow amount of the gas exiting from the gas supply mechanism 301 being passing through the optical element 101 side by decreasing the flow rate V1 on the optical element 101 side. Hence, the total amount of contaminants contained in the gas that passes through the optical element 101 side can be reduced, and as a result, fogging of the optical element 101 due to the purge gas can be reduced.

The first rectifying member 302 is more preferably shaped to satisfy the relational expression of S1 in <S2 in, where the cross-sectional areas at the inlet of the flow path (most upstream) are respectively denoted by "S1 in" and "S2 in". By reducing the size of the cross-sectional area of the inlet of the flow path (most upstream) on the optical element 101 side and increasing the size of the cross-sectional area on the substrate W side, the flow rate V1 on the optical element 101 side can be further decreased and the flow rate V2 on the substrate W side can be further increased, and as a result, fogging can be reduced. Additionally, the first rectifying member 302 is preferably shaped to satisfy the relational expression of S1 min<S2 min, where the minimum cross-sectional area of the flow path on the optical element 101 side is denoted by "S1 min" and the minimum cross-sectional area of the flow path on the substrate W side is denoted by "S2 min". This is because the flow rate V1 on the optical element 101 side can be further decreased and the flow rate V2 on the substrate W side can be further increased by reducing the size of the cross-sectional area of the inlet of the flow path on the optical element 101 side and increasing the size of the cross-sectional area on the substrate W side, and as a result, fogging can be reduced. Additionally, it is desirable that the first rectifying member 302 is shaped to satisfy the relational expression of $\beta 1 > \beta 2$, where $\beta 1 = S1$ min/S1 in, $\beta 2 = S2$ min/S2 in are defined.

Additionally, regarding the height, in the height of the flow path on the optical element 101 side, the ratio between the height H1 in at the inlet (most upstream), and the minimum height H1 min in the middle of the flow path is set to $\beta 1' = H1$ min/H1 in. Additionally, in the height of the flow path on the substrate W side, if the ratio between the height H2 in at the inlet and the minimum height H2 min in the middle of the flow path is set to $\beta 2' = H2$ min/H2 in, the first rectifying member 302 desirably has a shape that satisfies the relational expression $\beta 1' > \beta 2'$.

Figure 2:
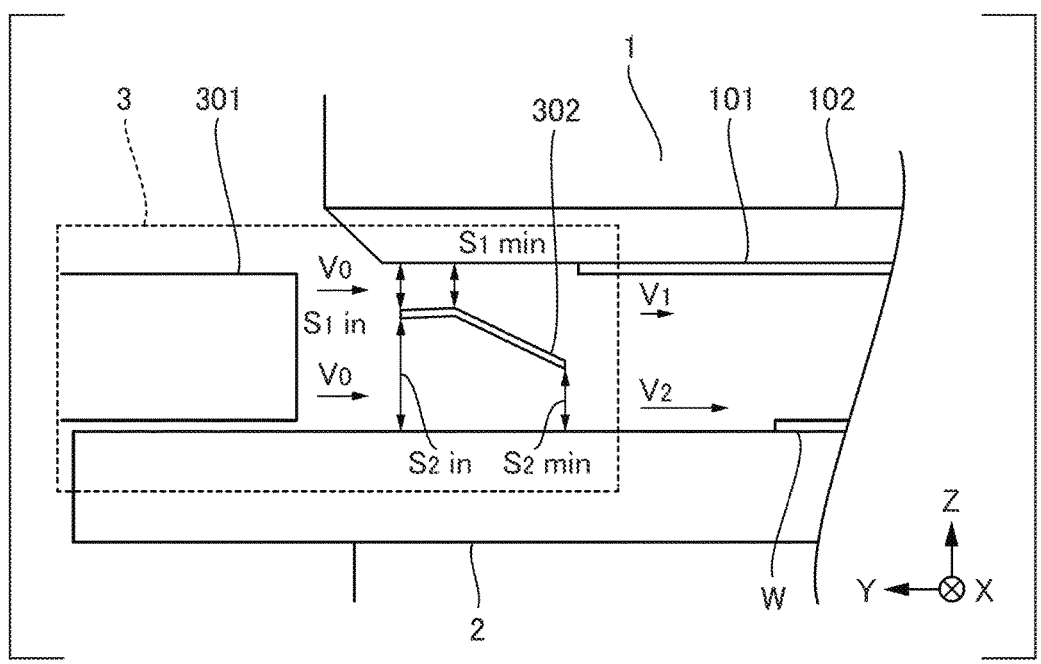
FIG. 2 illustrates a rectifying mechanism according to the first embodiment.

Although the first rectifying member 302 is a plate shape in FIG. 1, any shape may be applied if the height of the flow path on the substrate W side is smaller than the height of the flow path on the optical element 101 side, and a shape in which the first rectifying member 302 is bent toward the substrate W side on the axis X that is perpendicular to the optical axis and a flow path direction as shown in FIG. 2 may be applied. In addition, the first rectifying member 302 may be formed by bending it twice or more depending on the space of the apparatus, and may be configured by a flat surface and a curved surface, or may be configured only by a curved surface. For example, by forming the shape of the curved surface in a stream-line, the pressure loss in the flow path can be reduced and the flow rate V2 on the substrate W side can be further increased.

The first rectifying member 302 is preferably located as close as possible to the optical element 101. A flow rate distribution in which the flow rate on the substrate W side is higher than that on the optical element 101 side can be formed by passing the gas supplied from the gas supply mechanism 301 through the first rectifying member 302. However, as the gas flows in the flow path direction, the flow rate distribution is gradually unified and the effect of reducing fogging consequently decreases. Accordingly, it is preferable that the gas passes through the optical element 101 before the flow rate distribution is unified, and it is better to dispose the first rectifying member 302 in the vicinity of the optical element 101. Although the first rectifying member 302 is preferably connected to the rectifying mechanism 3 if the rectifying mechanism 3 is close to the optical element 101, it may be also connected to a holding member 102 that holds the projection optical system. Additionally, if the rectifying mechanism 3 is disposed distant from the optical element 101, the first rectifying member 302 may be connected only to the holding member 102.

Figure 3A:
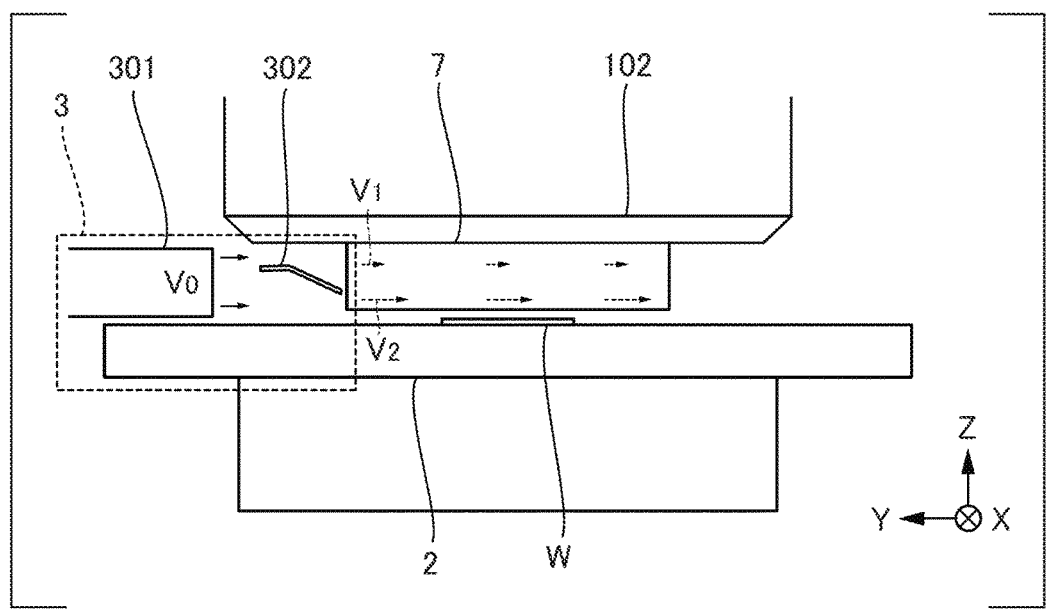
FIG. 3A illustrates a rectifying mechanism including a shielding member according to the first embodiment.
Figure 3B:
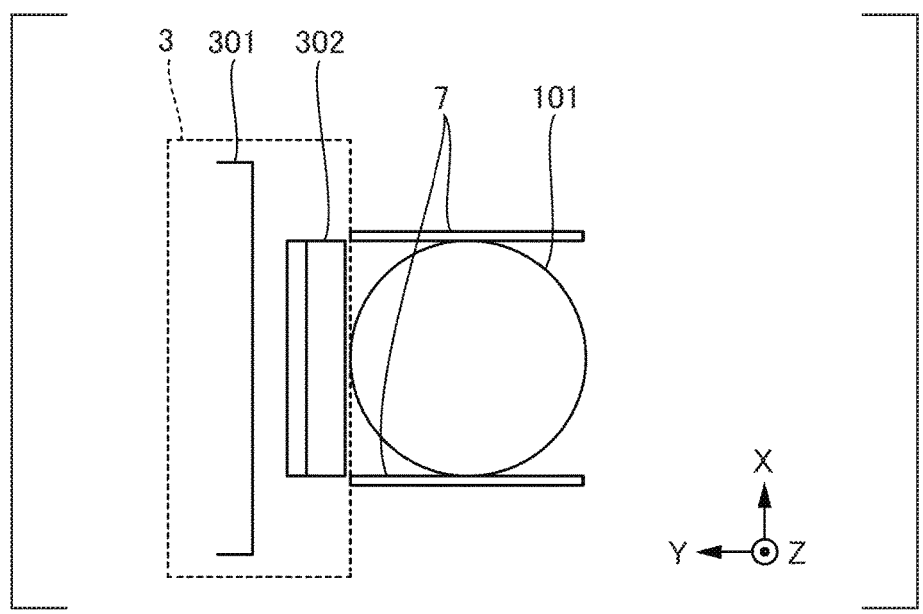
FIG. 3B illustrates a rectifying mechanism including a shielding member according to the first embodiment.

As shown in FIG. 3, a shielding member 7 may be provided in the exposure apparatus. FIG. 3A is a side view of the disposition of the shielding member 7, and FIG. 3B is another side view of the disposition of the shielding member 7. As shown in FIG. 3A, the shielding member 7 is disposed in the flow path direction that passes in the vicinity of the optical axis (exposure space), and as shown in FIG. 3B, the shielding member 7 is disposed outside the optical element 101. By disposing the shielding member 7, it is possible to reduce a gas other than the gas supplied from the gas supply mechanism 301 (hereinafter, referred to as "external gas") flown into the vicinity of the optical element 101. Contaminants are also contained in the external gas, and as a result, the total amount of the contaminants passing through the optical element 101 can be reduced, thereby reducing fogging. Additionally, since the inflow of the external gas can be reduced, a state in which the flow rate on the optical element 101 side is low can be maintained in a wider area.

Although the shielding member 7 is shaped in a plate shape having only a flat surface portion in FIG. 3B, it suffices to prevent the inflow of external gas, and thus it may be shaped to have a curved surface portion like an arc in accordance with the shape of a lens barrel, or may be shaped to combine a flat surface portion and a curved surface portion. Although the shielding member 7 is disposed on the holding member 102 side in FIG. 3A, it may be disposed on the moving stage 2 side or may be disposed so as to cover the space between the holding member 102 and the moving stage 2.

Figure 4:
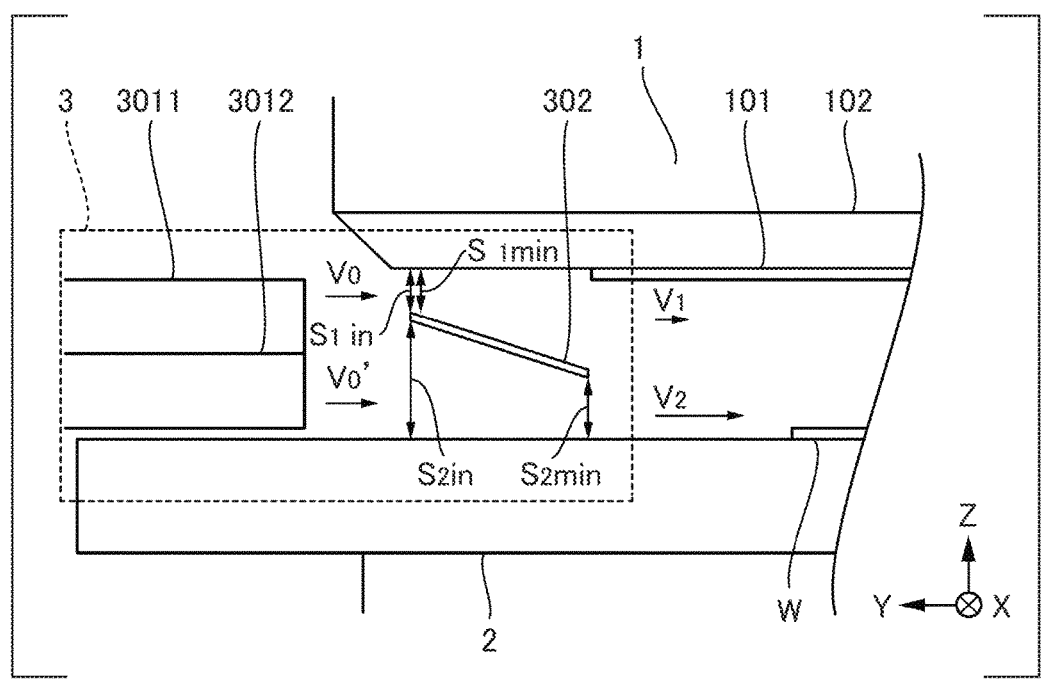
FIG. 4 illustrates a rectifying mechanism including a plurality of gas supply mechanisms according to the first embodiment.

As shown in FIG. 4A, a plurality of supply ports or gas supply mechanisms of the gas supply mechanisms 301 may be provided. In FIG. 4, two gas supply mechanisms, a gas supply mechanism 3011 and a gas supply mechanism 3012, are superimposed and arranged in the optical axis direction. The flow rate of the gases can be individually set by dividing the gas supply mechanism 301 into two. It is possible to further reduce the flow rate V1 on the optical element 101 side and further increase the flow rate V2 on the substrate W side by decreasing the flow rate V0 output from the gas supply mechanism 3011 on the optical element side and increasing the flow rate V0' output from the gas supply mechanism 3012 on the substrate side.

It is possible to further reduce a flow amount of the gas exiting from the gas supply mechanism 301 being passed through the optical element 101 side by decreasing the flow rate V1 on the optical element 101 side. Accordingly, the total amount of the contaminants contained in the gas passing through the optical element 101 side can be reduced, and as a result, fogging of the optical element 101 due to the purge gas can be reduced. In contrast, it is possible to reduce the reach of the resist gas exiting from the substrate W to the surface of the optical element 101 by increasing the flow rate V2 on the substrate W side, and as a result, fogging of the optical element 101 due to the resist gas can be reduced.

In FIG. 4, although two gas supply mechanisms are shown, any configuration may used if it has a plurality of supply ports or gas supply mechanisms that supply gases at different flow rates by which the flow rate on the optical element side can be reduced and the flow rate on the substrate side can be increased. Additionally, although the first rectifying member 302 is shown in FIG. 4, the first rectifying member 302 may not be disposed if a sufficient difference in flow rate (flow rate distribution) can be obtained only with the gas supply mechanism.

As described above, according to the present embodiment, since the gas having a low flow rate can be supplied on the optical element 101 side by the rectifying mechanism 3, fogging (contamination) of the optical element due to the contaminants contained in the gas and the inflow of air around the exposure space can be reduced. Furthermore, since a gas having a high flow rate can be supplied to the substrate W side by the rectifying mechanism 3, fogging (contamination) of the optical element due to contaminants generated from the substrate W can be reduced.

Second Embodiment

Figure 5A:
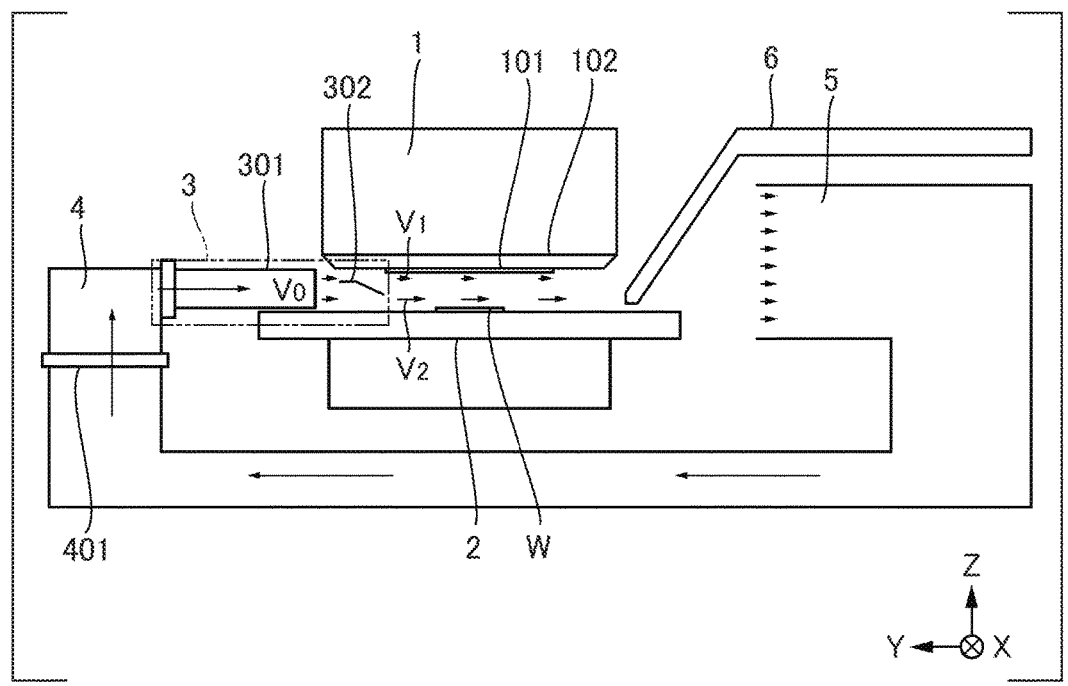
FIG. 5A illustrates a gas circulation system according to a second embodiment.

In the second embodiment, in addition to the rectifying mechanism of the first embodiment, a gas circulation system and an exhaust mechanism 6 are provided to form a rectified flow rate distribution. FIG. 5 illustrates a gas circulation system according to the present embodiment. As shown in FIG. 5A, the gas circulation system has the gas supply mechanism 301, the rectifying mechanism 3 that rectifies the supplied gas, a recovery port 5 that recovers a gas, and an environmental control device 4 that feeds the recovered gas to the gas supply mechanism 301. Note that what is not particularly described in the following description is the same as that in the first embodiment.

The gas supplied from the gas supply mechanism 301 is rectified by the rectifying mechanism 3, passes through the space between the optical element 101 and the substrate W (exposure space), and is recovered by the recovery port 5. The recovered gas passes through the environmental control device 4, is fed again to the rectifying mechanism 3, and circulated in the exposure device. The gas circulation system that circulates and supplies the gas in this exposure apparatus can improve the temperature control in the exposure apparatus, as compared with a system that supplies a fresh gas drawn from the outside of the exposure apparatus without circulating it. This is because the difference from the target temperature can be further reduced by circulating the temperature-controlled gas in the exposure apparatus again, compared with drawing a fresh gas, so that the accuracy of the temperature control is improved. Additionally, although the gas used in the present embodiment is air, it may be an inert gas such as nitrogen or helium. The inert gas such as nitrogen and helium can be reused by circulating the gas in the gas circulation system.

The environmental control device 4 is an air supply unit that feeds a gas to the gas supply mechanism 301. The environmental control device 4 may be provided with a chemical filter 401 for reducing the total amount of the contaminants contained in the gas that has been supplied from the gas supply mechanism 301. If the gas exiting from the gas supply mechanism 301 is returned to the recovery port 5 as-is, the life of the chemical filter 401 is shortened because the gas contains a resist gas generated from the substrate W. In recent years, although chemically amplified resists, for which the sensitivity for image formation is easily increased by a catalyst, are commonly used as resists applied to a substrate, contaminants are generated from this photoresist in the exposure process. Accordingly, the resist gas contains a large amount of contaminants among gases. If the chemical filter 401 reaches the end of its life, the contaminants cannot be removed completely, and the concentration of the contaminants contained in the gas exiting from the gas supply mechanism 301 increases, resulting in accelerating fogging of the optical element 101. Therefore, in the present embodiment, the exhaust mechanism 6 that discharges the resist gas to the outside without returning it to the recovery port 5 is provided.

Figure 5B:
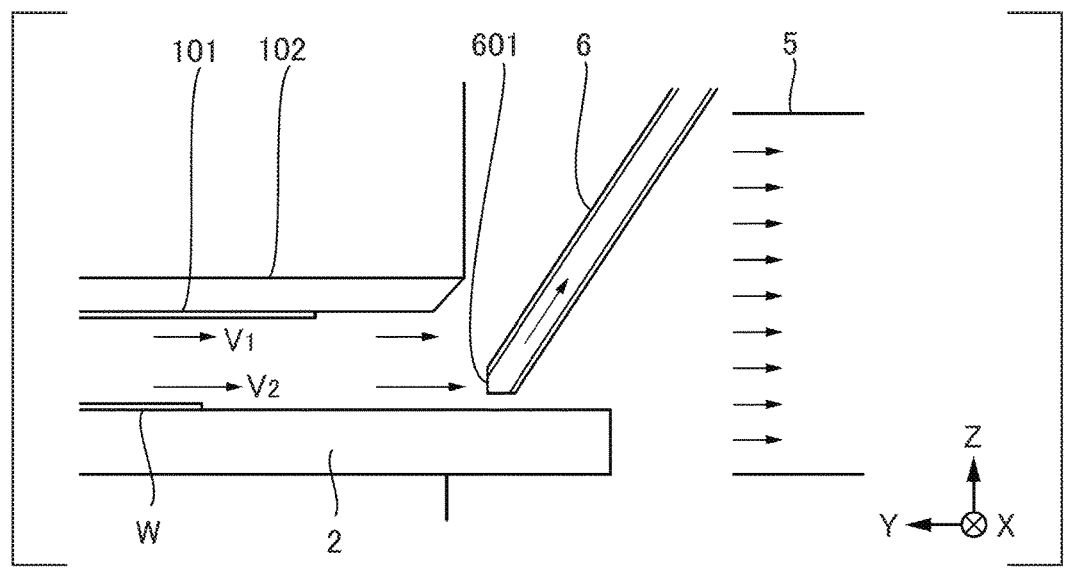
FIG. 5B illustrates a gas circulation system according to a second embodiment.

FIG. 5B is an enlarged view of the vicinity of the exhaust mechanism 6. The exhaust mechanism 6 is disposed on the downstream side of the substrate W and on the upstream side of the recovery port 5. In the exhaust mechanism 6, an exhaust port 601 that recovers the resist gas is disposed not on the holding member 102 side of the projection optical system but on the moving stage 2 side so as to easily recover the resist gas, with the exhaust port 601 facing the upstream side of the gas. The exhaust mechanism 6 discharges the gas to the outside by an exhaust fan. Instead of the exhaust fan, a vacuum pump may be used. By using the exhaust mechanism 6, the total amount of the resist gas recovered by the recovery port 5 can be reduced, so that the life of the chemical filter is extended and the frequency of clogging is also lowered. As a result, it is possible to obtain the effect of reducing fogging. Additionally, the effect of increasing the flow rate V2 on the substrate W side can be obtained by providing the exhaust mechanism 6 on the moving stage 2 side.

In FIG. 5B, the exhaust port 601 is located in a plane perpendicular to the flow path direction. Since the exhaust port 601 is only necessary to be located on the flow path of the resist gas, it may be located in a plane perpendicular to the optical axis, or it may be located in an oblique plane obtained by rotating a plane perpendicular to the flow path direction around the axis X. Additionally, the exhaust port 601 may be located not only in a flat surface alone, but also in a curved surface alone, or in both of a flat surface and a curved surface. Additionally, in the present embodiment, although the exposure apparatus including both the gas circulation system and the exhaust mechanism 6 has been described, one of the gas circulation system and the exhaust mechanism 6 is also effective in suppressing fogging of the optical element. Therefore, the exposure apparatus may include only one of the gas circulation system and the exhaust mechanism 6.

As described above, according to the present embodiment, since the gas having a low flow rate can be supplied to the optical element 101 side by the rectifying mechanism 3, it is possible to reduce fogging (contamination) of the optical element caused by contaminants contained in the gas and the inflow of air around the exposure space. Furthermore, since the gas having a high flow rate can be supplied to the substrate W side by the rectifying mechanism 3, fogging (contamination) of the optical element due to contaminants generated from the substrate W can be reduced. Additionally, the gas can be reused by providing the gas circulation system and the exhaust mechanism 6, and fogging of the optical element can be suppressed by removing contaminants.

Third Embodiment

In the third embodiment, in addition to the rectifying mechanism according to the first embodiment, a second rectifying member 303 is provided to form a rectified flow rate distribution. FIG. 6 illustrates a rectifying mechanism according to the present embodiment. Note that what is not particularly described in the following description are the same as those in the first embodiment and the second embodiment.

Figure 6A:
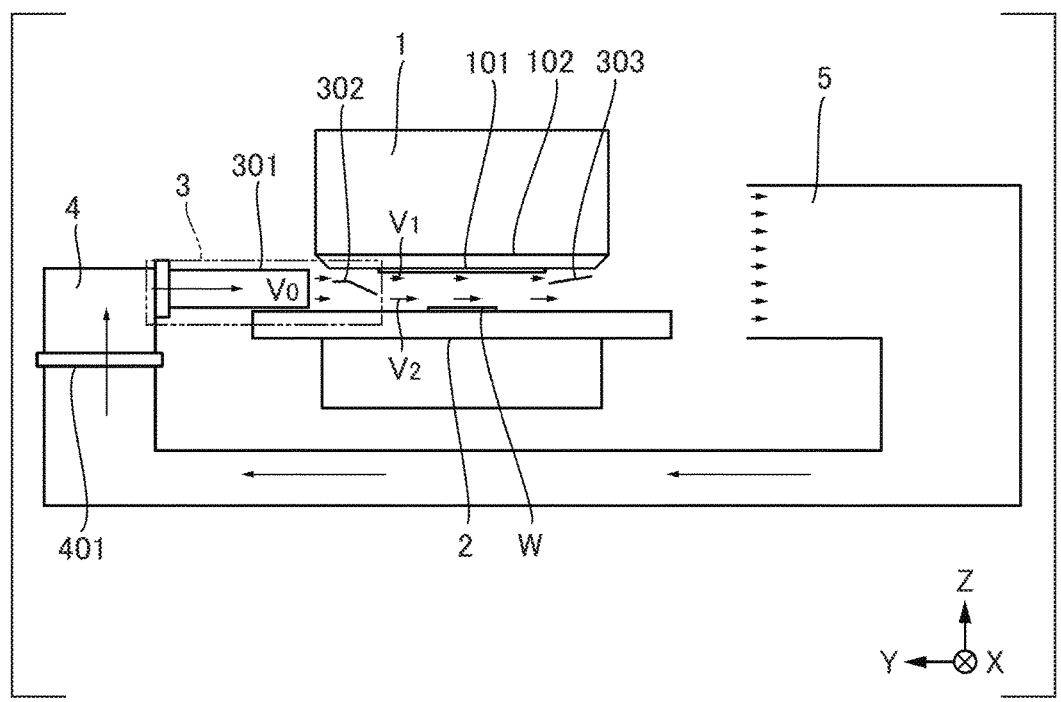
FIG. 6A illustrates a rectifying mechanism and a gas circulation system according to a third embodiment.

As shown in FIG. 6A, the gas supplied from the gas supply mechanism 301 passes through the first rectifying member 302, passes through the space between the optical element 101 and the substrate W (exposure space), and is recovered by the recovery port 5. The recovered gas passes through the environmental control device 4, is fed again to the rectifying mechanism 3, and is circulated in the exposure apparatus. The environmental control device 4 may include the chemical filter 401 in order to reduce the total amount of contaminants contained in the gas supplied from the gas supply mechanism 301. The second rectifying member 303 is provided between the exposure space and the recovery port 5 (on the downstream side of the exposure space), so that the effect of rectifying can be obtained in a wider range, and, in use of a large optical element, the effect of reducing fogging is obtained.

Figure 6B:
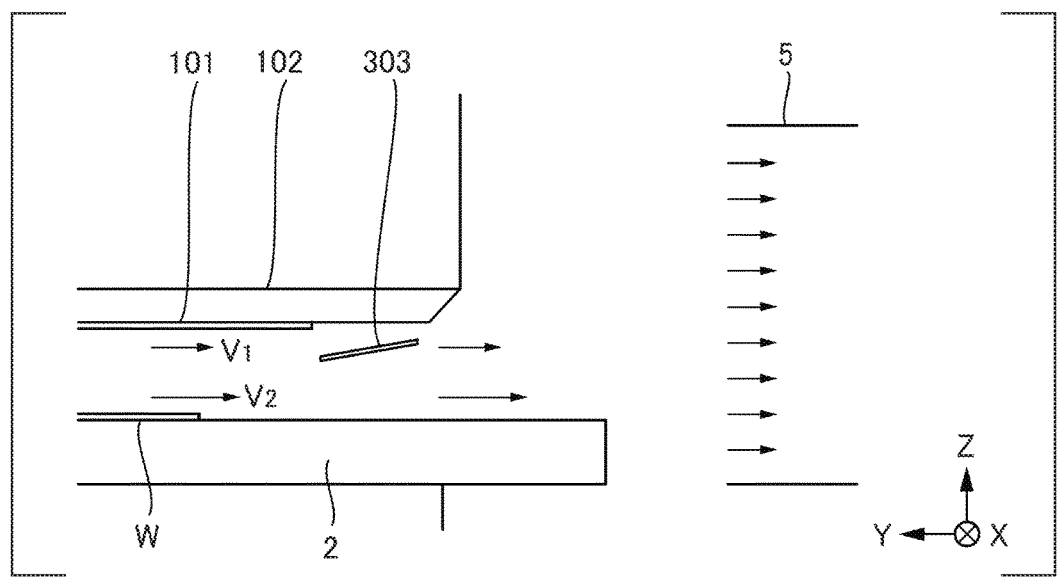
FIG. 6B illustrates a rectifying mechanism and a gas circulation system according to a third embodiment.

FIG. 6B is an enlarged view of the peripheral portion of the second rectifying member 303 shown in FIG. 6A. The second rectifying member 303 is disposed on the downstream side of the substrate W and on the upstream side of the recovery port 5 in the flow path direction, and is disposed between the optical element 101 and the moving stage 2 in the optical axis direction. Furthermore, it is more preferable that the second rectifying member 303 is disposed closer to the optical element 101 than the moving stage 2. The flow path is guided toward the substrate W side by providing the second rectifying member 303. As a result, by providing the second rectifying member 303, it is possible to maintain a flow rate distribution in which the fourth flow path on the substrate W side has a higher flow rate than the third flow path on the optical element 101 side in a wider range, thereby obtaining an effect for a larger optical element.

The shape of the second rectifying member 303 is not limited if the second rectifying member 303 is formed to serve as a resistor of the flow path on the optical element 101 side. For example, depending on the shape of the holding member 102 of the projection optical system, the second rectifying member 303 may be shaped in an arc around the optical axis so as to cover the holding member 102, or may be shaped in a plate having bending around the circumferential axis of the optical axis. Additionally, if there is no gap between the second rectifying member 303 and the holding member 102, contaminants are accumulated in that portion to cause fogging of the optical element 101 in some cases. Accordingly, it is more preferable that there is a gap between the optical element 101 and the second rectifying member 303. Although the circulation system is described in FIG. 6, the circulation system is not essential in the present embodiment, and it suffices if the second rectifying member 303 is provided on the downstream side of the substrate W.

As described above, according to the present embodiment, the gas having a low flow rate can be supplied to the optical element 101 side by the rectifying mechanism 3, so that it is possible to reduce fogging (contamination) of the optical element due to contaminants contained in the gas and the inflow of air around the exposure space. Furthermore, since the gas having a high flow rate can be supplied to the substrate W side by the rectifying mechanism 3, fogging (contamination) of the optical element due to contaminants generated from the substrate W can be reduced. Furthermore, the above effect can be obtained in a wider range by providing the second rectifying member 303.

Fourth Embodiment

Figure 7A:
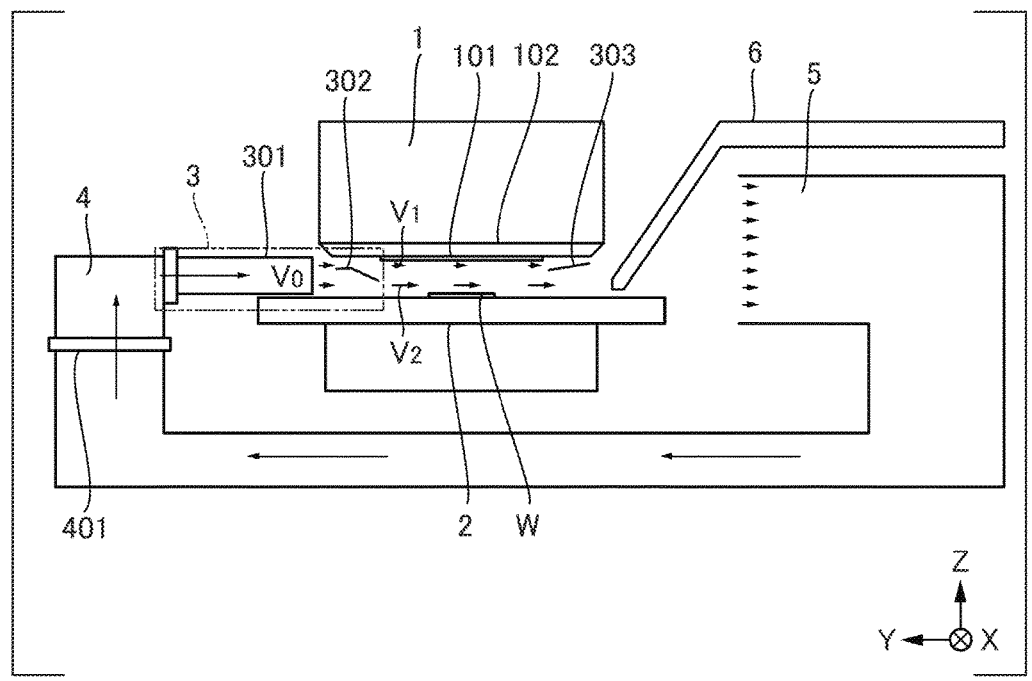
FIG. 7A illustrates a rectifying mechanism and a gas circulation system according to a fourth embodiment.

The fourth embodiment is an embodiment in which the second embodiment and the third embodiment are combined. FIG. 7A illustrates the rectifying mechanism of the fourth embodiment. As shown in FIG. 7A, the exposure apparatus of the present embodiment includes the rectifying mechanism 3, the second rectifying member 303, the exhaust mechanism 6, the recovery port 5 of the gas circulation system, and the environment control device 4. In the third embodiment, the same reference numerals are provided for parts that are the same as those in the first embodiment, and the detailed description thereof will be omitted.

Figure 7B:
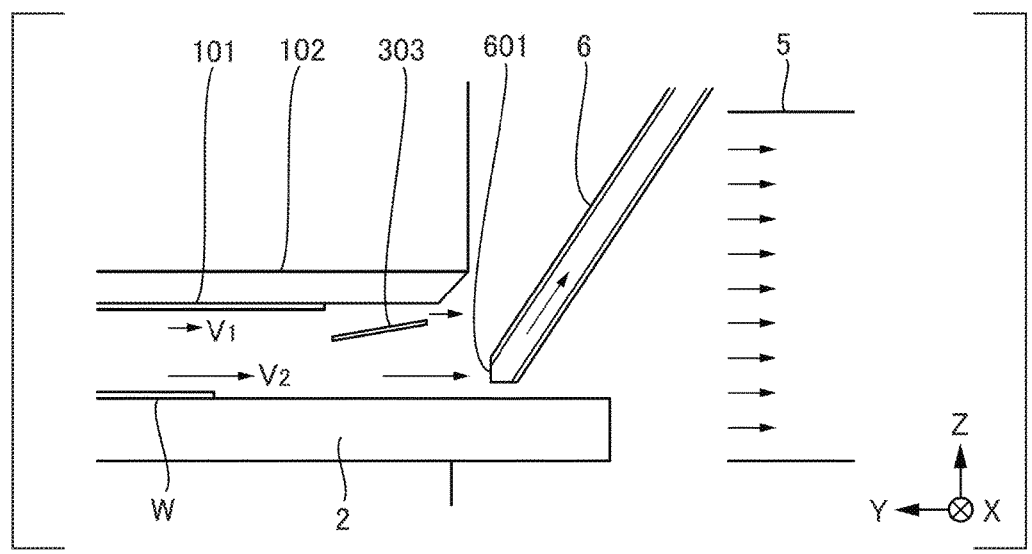
FIG. 7B illustrates a rectifying mechanism and a gas circulation system according to a fourth embodiment.

FIG. 7B is a partially enlarged view of the exhaust mechanism 6 and the second rectifying member 303 in FIG. 7A. In the exhaust mechanism 6, the exhaust port 601 is located on the downstream side of the substrate W and on the upstream side of the recovery port 5 in the flow path direction. Additionally, the second rectifying member 303 is disposed on the downstream side of the substrate W and on the upstream side of the exhaust port 601 in the flow path direction.

Additionally, the exhaust port 601 is preferably closer to the substrate W side than the optical element 101 in the optical axis direction. By locating the exhaust port 601 on the moving stage 2 side, the gas that is guided to the holding member 102 side by the second rectifying member 303 is recovered by the recovery port 5 instead of entering the exhaust port 601 located on the moving stage 2 side. In contrast, in the second rectifying member 303, the gas containing a large amount of resist gas, which has been guided to the moving stage 2 side, is easily sucked into the exhaust port 601 located on the moving stage 2 side and is easily discharged from the exhaust mechanism 6. The flow path cross-sectional area of the resist gas generated from the substrate W can be further reduced by the second rectifying member 303, and it suffices to discharge only a gas in the reduced area so that the efficiency in discharging the resist gas increases.

Additionally, the total amount of the resist gas recovered at the recovery port 5, can be further reduced by increasing the efficiency of the exhaust so that the life of the chemical filter is extended and the frequency of clogging also decreases. As a result, it is possible to obtain the effect of reducing fogging. As described above, according to the present embodiment, it is possible to increase the efficiency of discharging the resist gas in the exhaust mechanism 6, and it is effective in reducing fogging of the optical element.

Fifth Embodiment

The fifth embodiment is different from the first embodiment in the shape of the first rectifying member 302. FIG. 8 illustrates the rectifying mechanism 3 in the fifth embodiment. The rectifying mechanism 3 is a rectifying mechanism that supplies a rectified gas to the space between the optical element 101 located on the final surface of the projection optical system 1 and the substrate W placed on the moving stage 2. Note that what is not particularly described in the following description is the same as that in the first embodiment.

Figure 8A:
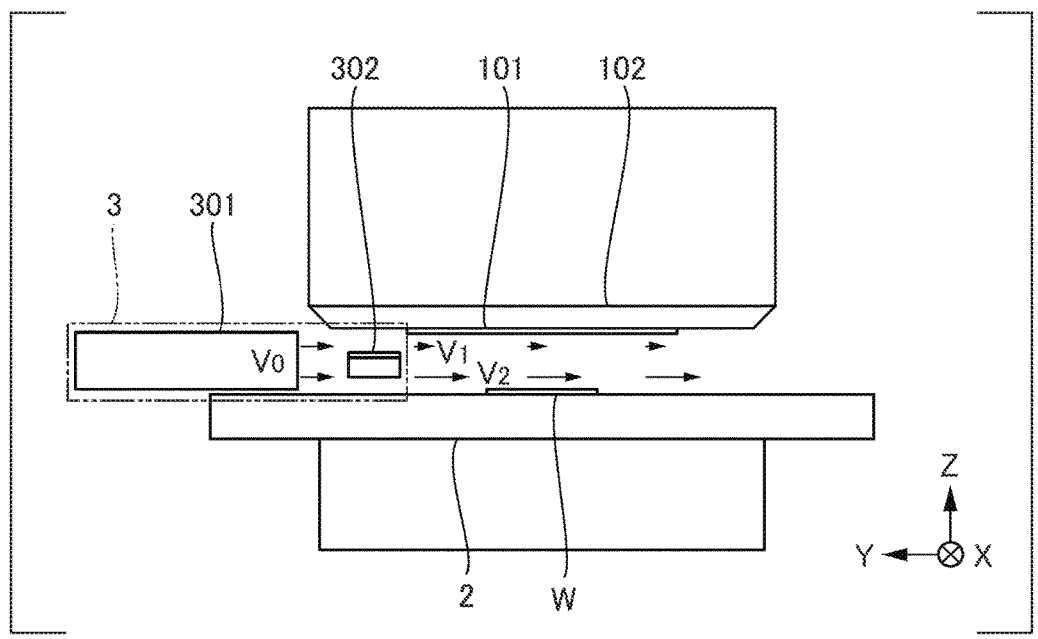
FIG. 8A illustrates a rectifying mechanism according to a fifth embodiment.

As shown in FIG. 8A, the rectifying mechanism 3 is used to supply a rectified gas to the space between the optical element 101 located on the final surface of the projection optical system 1 and the substrate W placed on the moving stage 2. In a manner similar to the first embodiment, the first rectifying member 302 is located so as to divide the gas exiting from the gas supply mechanism 301 into two flow paths, the optical element 101 side and the substrate W side.

Figure 8B:
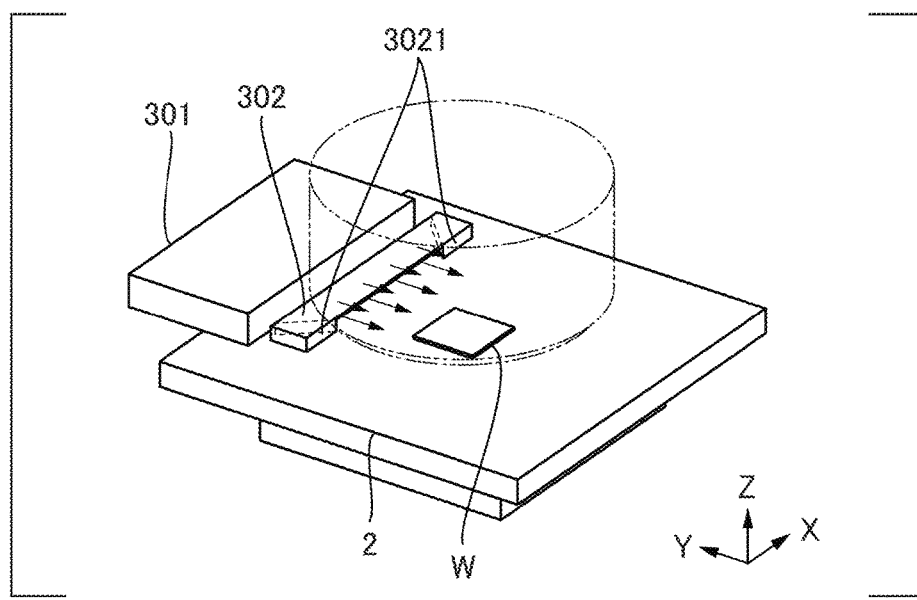
FIG. 8B illustrates a rectifying mechanism according to a fifth embodiment.

As shown in FIG. 8B, the first rectifying member 302 has a throttle unit 3021 that adjusts conductance, where, in the plane perpendicular to the optical axis, the width of the flow path on the substrate W side is reduced more than that on the optical element 101 side. The width of the flow path on the substrate W side is reduced by providing the throttle unit 3021, and consequently, the flow rate increases. Additionally, it is not necessary to reduce the height of the flow path by providing the throttle unit 3021 in a plane perpendicular to the optical axis. The present embodiment is effective in the case in which the space between the optical element 101 and the substrate W is small, and there is an enough space in the axis X direction. Although the throttle unit 3021 is formed to minimize the outlet of the flow path of the first rectifying member 302 in the flow path direction, any shape may be applied if the cross-sectional area in the middle of the flow path is smaller in width than that of the inlet of the first rectifying member 302. In FIG. 8B, although only the plane perpendicular to the optical axis is reduced while not reducing the height of the flow path, the height of the flow path may also be reduced.

As described above, according to the present embodiment, since the gas having a low flow rate can be supplied to the optical element 101 side by the rectifying mechanism 3, it is possible to reduce fogging (contamination) of the optical element due to contaminants contained in the gas and the inflow of air around the exposure space. Furthermore, since the gas with a high flow rate can be supplied to the substrate W side by the rectifying mechanism 3, fogging (contamination) of the optical element due to contaminants generated from the substrate W can be reduced.

Sixth Embodiment

The sixth embodiment is different from the first embodiment with respect to the shape of the first rectifying member 302. FIG. 9 illustrates the rectifying mechanism 3 in the sixth embodiment. The rectifying mechanism 3 is a rectifying mechanism that supplies the rectified gas to the space between the optical element 101 located on the final surface of the projection optical system 1 and the substrate W placed on the moving stage 2. Note that what is not described in particular in the following description is the same as that in the first embodiment.

Figure 9A:
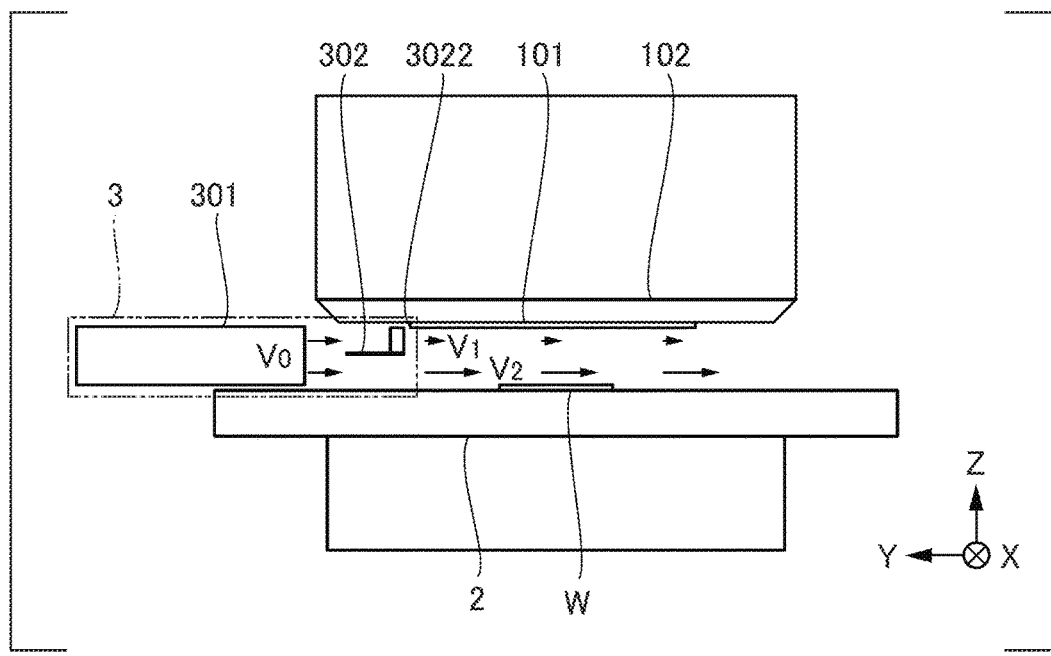
FIG. 9A illustrates a rectifying mechanism according to a sixth embodiment.

The rectifying member 302 is disposed so as to divide a gas exiting from the gas supply mechanism 301 into two flow paths, the optical element 101 side and the substrate W side. As shown in FIG. 9A, the shape is such that a pressure loss filter 3022 is provided on the flow path in the flow path on the optical element 101 side. As compared with a case in which the pressure loss filter 3022 is not provided, the difference between the pressure loss in the flow path on the optical element 101 side and the pressure loss in the flow path on the substrate W side can be increased by providing the pressure loss filter 3022 in the flow path on the optical element 101 side. Accordingly, the flow rate V1 on the optical element 101 side can be further reduced and the flow rate V2 on the substrate W side can be further increased, and as a result, an effect of reducing fogging can be obtained.

Figure 9B:
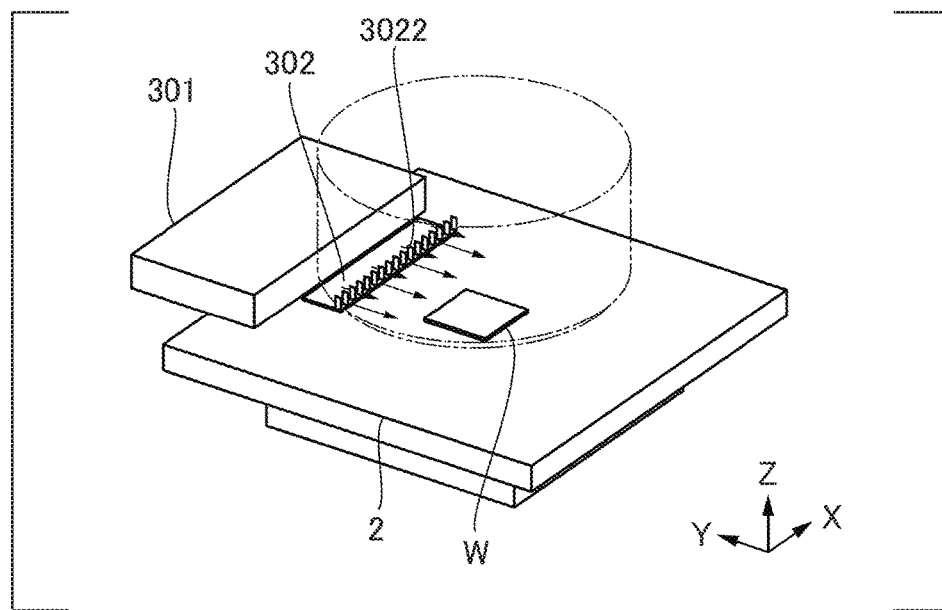
FIG. 9B illustrates a rectifying mechanism according to a sixth embodiment.

The pressure loss filter 3022 is formed, for example, in a slit shape as shown in FIG. 9B. However, the present invention is not limited to the shape of the pressure loss filter 3022, and any shape may be used if the filter can serve as a member that adjusts conductance, for example, a punching metal. In FIG. 9A, although the pressure loss filter 3022 is disposed at the outlet of the flow path of the first rectifying member 302, it may be arranged at the inlet of the flow path or in the middle of the flow path. Additionally, the first rectifying member 302 may be configured to further include a member that adjusts conductance shown in the fifth embodiment.

As described above, according to the present embodiment, the gas having a low flow rate can be supplied to the optical element 101 side by the rectifying mechanism 3, so that fogging (contamination) of the optical element due to contamination contained in the gas and the inflow of air around the exposure space can be reduced. Furthermore, since the gas with a high flow rate can be supplied to the substrate W side by the rectifying mechanism 3, fogging (contamination) of the optical element due to contaminants generated from the substrate W can be reduced.

Embodiment Relating to Exposure Apparatus

Figure 10:
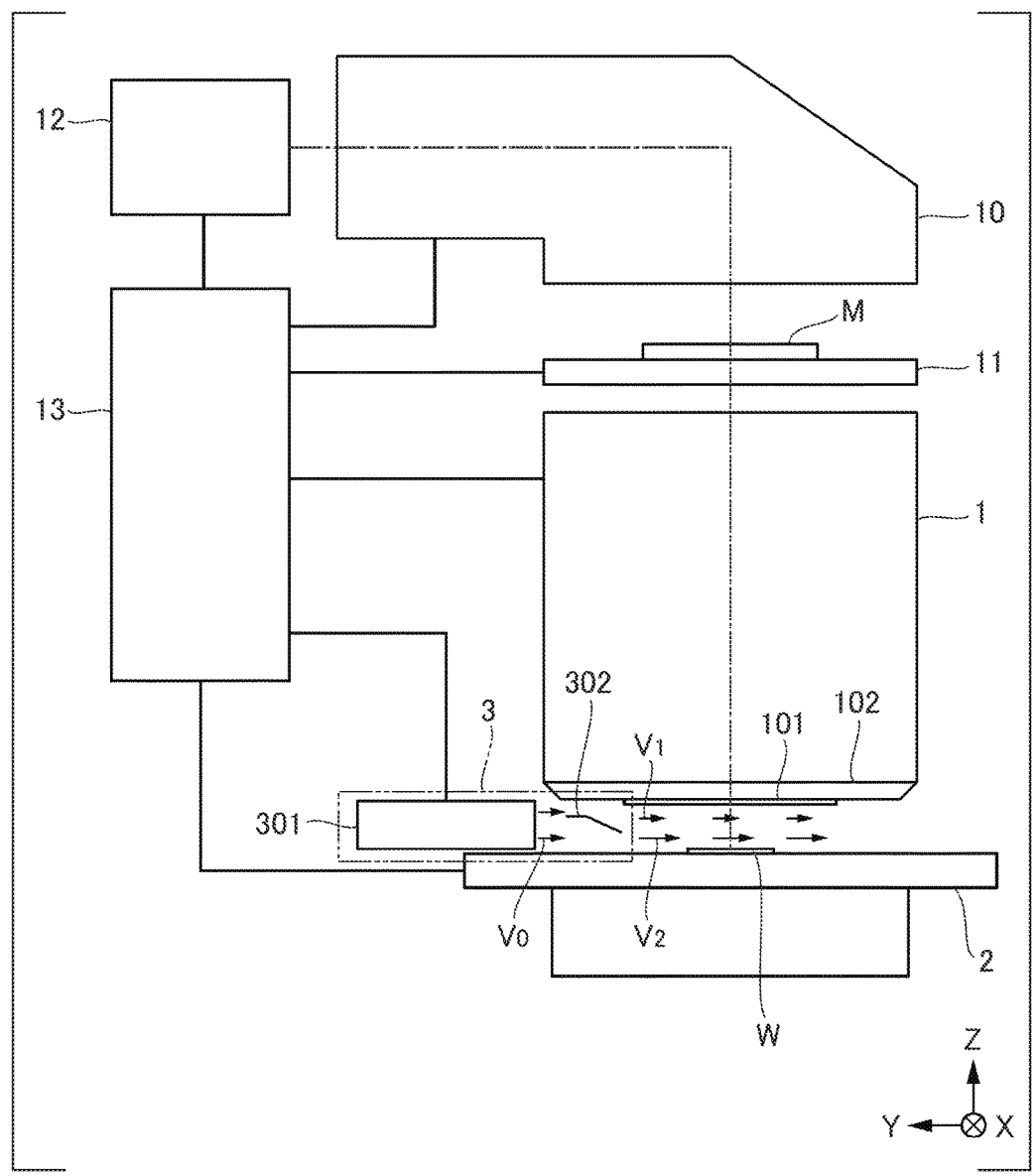
FIG. 10 illustrates an exposure apparatus including a rectifying mechanism.

FIG. 10 illustrates an exposure apparatus including the rectifying mechanism 3. The exposure apparatus includes an illumination optical system 10, an original stage 11, the projection optical system 1, the moving stage 2, and a control unit 13 that controls them. The illumination optical system 10 uses a light from a light source 12 to illuminate an original M held by the original stage 11. The original stage 11 holds the original M on which a pattern has been formed and can move it, for example, in the X and Y directions. The projection optical system 1 projects and transfers a pattern image from the original M onto the substrate held by the moving stage 2. The projection optical system 1 is configured by a plurality of optical elements, where the optical element 101 is the closest to the substrate W among the optical elements and serves as the final surface of the optical path. The exposure apparatus can include the rectifying mechanism 3 described in each embodiment, a gas circulation system (not illustrated), the exhaust mechanism 6, the second rectifying member 303, and the like. It is possible to suppress fogging of the optical element 101 due to the adhering of contamination on the surface of the optical element 101 by providing the rectifying mechanism 3 and the like. [Embodiment relating to article manufacturing method]

An article manufacturing method according to the present embodiment is suitable for manufacturing an article such as a micro device, for example, a semiconductor device and an element having a fine structure. The article manufacturing method according to the present embodiment includes a step that forms a latent image pattern on a photosensitive agent applied to a substrate by using the above exposure apparatus (a step of exposing a substrate), and a step that processes (develops) a substrate on which the latent image pattern has been formed in the step. Additionally, the manufacturing method includes other well-known steps (for example, oxidation, film formation, vapor deposition, doping, planarization, etching, resist peeling, dicing, bonding, and packaging). The article manufacturing method according to the present embodiment is advantageous in at least one of performance, quality, productivity, and production cost of an article, as compared with conventional methods.

Although the preferred embodiments of the present invention have been described above, the present invention is not limited to these embodiments, and various modifications and changes are possible within the scope of the gist thereof.

The invention claimed is:

1. An exposure apparatus that exposes a substrate via an original plate and a projection optical system comprising:
   a supply unit configured to supply a gas so as to cross the optical axis of the projection optical system in a space between the projection optical system and the substrate facing each other,
   wherein the supply unit supplies the gas such that the gas crossing the optical axis in the space has a flow rate distribution in which a flow rate at a second position located farther from the projection optical system than a first position is higher than a flow rate at the first position, and
   wherein the supply unit includes a first rectifying member that forms the flow rate distribution by dividing a flow path of the gas into a first flow path of the gas flowing to the first position and a second flow path of the gas flowing to the second position.

2. The exposure apparatus according to claim 1, wherein the following relational expression is satisfied:

$$S1\ min/S1\ in > S2\ min/S2\ in,$$

where the cross-sectional area at the most upstream side of the first flow path is denoted by "S1 in", the minimum cross-sectional area of the first flow path is denoted by "S1 min", the cross-sectional area at the most upstream of the second flow path is denoted by "S2 in", and the minimum cross-sectional area of the second flow path is denoted by "S2 min".

3. The exposure apparatus according to claim 1, wherein the following relational expression is satisfied:

$$H1\ min/H1\ in > H2\ min/H2\ in,$$

where, in the optical axis direction, the height at the uppermost stream of the first flow path is denoted by "H1 in", the minimum height of the first flow path is denoted by "H1 min", the height at the uppermost stream of the second flow path is denoted by "H2 in", and the minimum height of the second flow path is denoted by "H2 min".

4. The exposure apparatus according to any one of claim 1,
   wherein, in the optical axis direction, the height of the first flow path increases from the upstream toward the downstream.

5. The exposure apparatus according to any one of claim 1,
   wherein the first rectifying member includes a member configured to adjust conductance of at least one of the first flow path and the second flow path.

6. The exposure apparatus according to any one of claim 1,
   wherein the supply unit includes a plurality of supply ports configured to supply gases with a plurality of different flow rates such that the gas traversing the optical axis in the space has the flow rate distribution.

7. The exposure apparatus according to any one of claim 1, further comprising a shielding member configured to shield the inflow of a gas different from the gas supplied by the supply unit into the space.

8. The exposure apparatus according to any one of claim 1, further comprising a second rectifying member configured to form the flow rate distribution by dividing a flow path of a gas into to a third flow path of the gas that has flown through the first position and a fourth flow path of the gas that has flown through the second position, downstream of the space.

9. The exposure apparatus according to any one of claim 1, further comprising:

a recovery port configured to recover the gas that has passed through the space; and an air feed unit configured to feed the gas recovered from the recovery port to the supply unit.

10. The exposure apparatus according to claim 9, wherein the air feed unit includes a filter that removes contaminants contained in a gas.

11. The exposure apparatus according to any one of claim 1, further comprising an exhaust port configured to discharge the gas that has flown through the second position among the gases that have passed through the space.

12. The exposure apparatus according to any one of claim 1, wherein the gas supplied by the supply unit includes an inert gas.

13. An article manufacturing method comprising:

exposing a substrate using an exposure apparatus; and, developing the substrate exposed in the exposing wherein the exposure apparatus is configured to exposes a substrate via an original plate and a projection optical system and includes a supply unit configured to supply a gas so as to cross the optical axis of the projection optical system in a space between the projection optical system and the substrate facing each other, wherein the supply unit supplies the gas such that the gas crossing the optical axis in the space has a flow rate distribution in which a flow rate at a second position located farther from the projection optical system than a first position is higher than a flow rate at the first position, and wherein the supply unit includes a first rectifying member that forms the flow rate distribution by dividing a flow path of the gas into a first flow path of the gas flowing to the first position and a second flow path of the gas flowing to the second position.

* * * * *